United States Patent [19]
Kataoka et al.

[11] Patent Number: 6,159,827
[45] Date of Patent: Dec. 12, 2000

[54] PREPARATION PROCESS OF SEMICONDUCTOR WAFER

[75] Inventors: Makoto Kataoka, Aichi-ken; Yasuhisa Fujii, Aichiken; Kentaro Hirai, Aichi-ken; Hideki Fukumoto, Aichi-ken; Masatoshi Kumagai, Aichi-ken, all of Japan

[73] Assignee: Mitsui Chemicals, Inc., Japan

[21] Appl. No.: 09/285,702

[22] Filed: Apr. 5, 1999

[30] Foreign Application Priority Data

Apr. 13, 1998 [JP] Japan .................................. 10-100860

[51] Int. Cl.[7] ............................ H01L 21/46; H01L 21/78
[52] U.S. Cl. ........................ 438/464; 438/460; 438/759; 438/928; 438/974; 438/976; 438/977; 156/344
[58] Field of Search .................................... 438/460, 464, 438/759, 928, 974, 976, 977; 156/344

[56] References Cited

U.S. PATENT DOCUMENTS

| | | | |
|---|---|---|---|
| 5,853,533 | 12/1998 | Yasunaga et al. | 156/584 |
| 5,976,954 | 11/1999 | Kimura et al. | 438/464 |

FOREIGN PATENT DOCUMENTS

| | | |
|---|---|---|
| 60-189938 | 9/1985 | Japan . |
| 2-028950 | 9/1993 | Japan . |
| 7-201787 | 12/1993 | Japan . |
| 8-222535 | 2/1995 | Japan . |
| 8-258038 | 3/1995 | Japan . |

*Primary Examiner*—John F. Niebling
*Assistant Examiner*—David A. Zarneke
*Attorney, Agent, or Firm*—Burns, Doane, Swecker, & Mathis, L.L.P.

[57] ABSTRACT

An object of the invention is to provide a preparation process of a semiconductor wafer, in which breakage of the wafer on grinding the back surface of the wafer and on peeling the adhesive tape is prevented, and the operation time can be reduced. The preparation process of a semiconductor wafer comprises the steps of: adhering an adhesive tape on a front surface of a semiconductor wafer; grinding a back surface of the semiconductor wafer by a grinding machine; peeling the adhesive tape; and cleaning the front surface of the semiconductor wafer, wherein an adhesive tape having heat shrinkability is used as the adhesive tape, and after grinding the back surface of the semiconductor wafer, warm water at a temperature of from 50 to 99° C. is poured to peel the adhesive tape in a wafer cleaning machine, and the front surface of the semiconductor wafer is cleaned in the wafer cleaning machine.

21 Claims, No Drawings

PREPARATION PROCESS OF SEMICONDUCTOR WAFER

BACKGROUND OF THE INVENTION

1. Field of the Invention

The present invention relates to a preparation process of a semiconductor wafer. More particularly, it relates to a preparation process of a semiconductor, which comprises adhering a surface protective adhesive tape having a heat shrinkability on a surface of a semiconductor wafer, such as a silicon wafer, on which an integrated circuit is installed (hereinafter referred to as a front surface of a wafer) grinding another surface of the semiconductor wafer, on which an integrated circuit is not installed (hereinafter referred to as a back surface of a wafer); peeling the adhesive tape from the front surface of the wafer by pouring warm water into the adhesive tape in a wafer cleaning machine; and cleaning the semiconductor wafer in the wafer cleaning machine.

2. Description of the Related Art

A semiconductor integrated circuit (hereinafter referred to as an IC) is generally produced by a process, which comprises slicing a high purity silicon single crystal to make a semiconductor wafer, installing an integrated circuit by a means, such as an etching process, grinding a back surface of the wafer, and dicing to make a chip.

These steps include a step of grinding the back surface of the wafer to thin the thickness of the wafer to an arbitrary thickness after installation of the IC on the front surface of the semiconductor wafer. In this step, an adhesive tape for protecting the front surface of the semiconductor wafer (hereinafter referred to as an adhesive tape) is used by adhering on the front surface of the wafer. After completing the grinding of the back surface of the semiconductor wafer, the adhesive tape is peeled from the front surface of the wafer by a peeling machine. As a method for peeling, a method has been disclosed in JP-A-2-28950, in which a tape having a strong adhesive force called a peeling tape is adhered on the surface of the base film of the adhesive tape, and the adhesive tape is peeled by utilizing the adhesive force.

On the front surface of the semiconductor wafer after peeling of the adhesive tape, a slight amount of an impurity is transferred from the adhesive layer of the adhesive tape. Therefore, the semiconductor wafer is cleaned with an organic solvent, such as isopropyl alcohol and acetone, or pure water in a cleaning machine. In general, pure water is used. There are some methods for cleaning with pure water. For example, a method, in which pure water is poured onto respective single wafers (single wafer process), and a method, in which a cartridge containing about 25 wafers is immersed in a water bath containing pure water overflowing (cartridge process) can be exemplified.

In general, the period of time for grinding the back surface of the semiconductor wafer is about from 100 to 240 minutes per 100 wafers. The period of time for peeling the adhesive tape is about from 140 to 200 minutes per 100 wafers. The period of time for cleaning of the semiconductor wafer carried out after the peeling of the adhesive tape is about from 140 to 600 minutes per 100 wafers.

In recent years, along with the miniaturization of a semiconductor chip, there is a tendency of thinning the wafer. The thickness of the wafer, which has been conventionally about from 200 to 400 $\mu$m, becomes as thin as about 150 $\mu$m. The size (diameter) of the wafer, which has been 8 inches at most, also tends to be becoming as large as about 12 inches and further 16 inches. According to such a tendency in that the wafer becomes thin and large, the semiconductor wafer sometimes largely warps after grinding the back surface thereof. On the conditions in that an adhesive tape is adhered on the front surface of the semiconductor wafer, such a tendency of warp becomes larger due to the tension of the tape. Therefore, the semiconductor wafer is liable to be broken on peeling the adhesive tape from the front surface of the semiconductor wafer. Furthermore, the semiconductor wafer is also liable to be broken due to vibration on the transfer between the steps, such as transfer from the step of grinding the back surface of the wafer to the step of peeling the adhesive tape, and transfer from the step of peeling the adhesive tape to the step of cleaning the wafer.

In order to prevent the wafer from breakage on peeling the adhesive tape from the front surface of the semiconductor wafer, a surface protective adhesive tape improved in peeling property has been proposed. For example, JP-A-60-189938 discloses a process, in which on grinding the back surface of the semiconductor wafer, an adhesive tape comprising a light transmissible support having thereon a pressure-sensitive adhesive having a property in that it is hardened by light irradiation to form a three-dimensional network is adhered on the front surface of the wafer, and after grinding, a light is irradiated to the adhesive tape, to peel the tape without damaging the wafer.

However, the pressure-sensitive adhesive disclosed in JP-A-60-189938 is an adhesive that is polymerized through radical polymerization, and when oxygen is included between the wafer and the adhesive layer, the hardening reaction cannot sufficiently proceed due to the polymerization inhibition effect of oxygen. Therefore, on peeling the adhesive tape from the front surface of the wafer, an unhardened adhesive having a low cohesive force may remain on the front surface of the wafer, to contaminate the front surface of the wafer. Because an integrated circuit is installed on the front surface of the semiconductor wafer to form complicated unevenness, it is extremely difficult to adhere the adhesive tape without inclusion of the air (oxygen). In order to make a system excluding oxygen to adhere the tape, another apparatus must be newly provided. Such contamination due to the adhesive sometimes can be removed by cleaning with an organic solvent, but in most cases, cannot be completely removed at the present time. In this process, the breakage of the wafer tends to occur on transferring from the peeling step to the cleaning step. Furthermore, it requires the peeling step and the cleaning step, and thus there is no effect on reduction in operation time.

JP-A-8-222535 discloses a method for using an adhesive tape for protection of a front surface of a semiconductor wafer, the tape comprising a stretched film of an ethylene-vinyl acetate copolymer having a shrinking rate at 25° C. of less than 5% and a shrinking rate on immersing in warm water at a temperature of from 50 to 80° C. of from 5 to 50% having on one surface thereof an adhesive layer. The substance thereof resides in a process, in which the adhesive tape is adhered on the front surface of the semiconductor wafer, and after grinding the back surface of the semiconductor wafer, it is immersed in warm water at a temperature of from 50 to 80° C. to peel the adhesive tape from the front surface of the wafer. However, in the method of immersing in warm water, for example, the back surface of the semiconductor wafer cannot be fixed on a chuck table of a peeling machine. Accordingly, it is difficult to protect the semiconductor wafer from the peeling stress of the adhesive tape, and therefore it is impossible to completely prevent the wafer from breakage on peeling the adhesive tape.

In recent years, along with the progress of a semiconductor wafer of large size and small thickness, and an IC of high performance, a preparation process of a semiconductor wafer is demanded, in which contamination of the front surface of the semiconductor wafer is small; the wafer is difficult to be damaged on grinding the back surface of the wafer and peeling the adhesive tape, and the operation time can be reduced.

SUMMARY OF THE INVENTION

An object of the invention, in view of the problems described above, is to provide a preparation process of a semiconductor wafer, in which the wafer is difficult to be damaged on grinding the back surface of the wafer, and on peeling the adhesive tape from the front surface of the semiconductor wafer, and the operation time can be reduced.

As a result of earnest investigation by the inventor to accomplish the object described above, it has been found that the adhesive tape can be easily peeled without damaging the semiconductor wafer, and the conventional step of peeling the adhesive tape can be omitted by a process in that a surface protective adhesive tape having a heat shrinkability is employed; it is adhered on a surface of a wafer; grinding the back surface thereof is conducted by a back surface grinding machine for a semiconductor wafer; the wafer is transferred to a cleaning step without peeling the surface protective adhesive tape; and warm water is poured onto the adhesive tape to heat and shrink, thus, the invention completed.

That is, the invention relates to a preparation process of a semiconductor wafer, the process comprising the steps of: adhering an adhesive tape on a front surface of a semiconductor wafer; grinding a back surface of the semiconductor wafer by a grinding machine; peeling the adhesive tape; and cleaning the front surface of the semiconductor wafer, wherein an adhesive tape having heat shrinkability is used as the adhesive tape, and after grinding the back surface of the semiconductor wafer, warm water at a temperature of from 50 to 99° C. is poured to peel the adhesive tape in a wafer cleaning machine, and the front surface of the semiconductor wafer is cleaned in the wafer cleaning machine.

According to the invention, in the case where the back surface of a semiconductor wafer having a diameter of from 6 to 16 inches is ground to a thickness of from 80 to 400 $\mu$m, the semiconductor wafer is not broken on peeling the adhesive tape for protecting the front surface of the semiconductor wafer. Furthermore, because it is a process, in which the adhesive tape is peeled simultaneously with cleaning the wafer in the cleaning machine, the conventional peeling step can be omitted, and also the transfer step from the peeling step to the cleaning step can be omitted. According to the invention, therefore, it is possible to decrease the fraction defective due to breakage of the semiconductor wafer, and is possible to reduce the operation time of the series of steps from the grinding of the back surface of the wafer to the cleaning.

DETAILED DESCRIPTION OF PREFERRED EMBODIMENT

The invention will be described in detail below. The substance of the invention resides in that a release film is peeled from an adhesive layer of an adhesive tape for protection of a front surface of a semiconductor wafer (hereinafter referred to as an adhesive tape), to expose a surface of the adhesive layer, and the adhesive tape is adhered on a surface of the semiconductor wafer, on which an integrated circuit is installed, (front surface of the wafer) through the adhesive layer. The semiconductor wafer is fixed on a chuck table of a grinding machine through a base film layer of the adhesive tape, and a back surface of the semiconductor wafer is ground. After completing the grinding, the semiconductor wafer is transferred to a cleaning machine without peeling the adhesive tape. In the wafer cleaning machine, the back surface of the wafer is fixed on a chuck table, warm water at a temperature of from 50 to 99° C. (preferably from 50 to 80° C.) is poured onto the adhesive tape while fixing, to peel the adhesive tape. The semiconductor wafer is then cleaned in the wafer cleaning machine. Thereafter, the wafer is taken out from the cleaning machine, and installed in a cartridge to be transferred to the subsequent step, such as a dicing step.

The adhesive tape used in the invention comprises a base film having a heat shrinkability having formed on one surface thereof an adhesive layer. In order to protect the adhesive layer on storage and transportation, a release film called a separator is preferably adhered on the surface of the adhesive layer.

In a process for producing the adhesive tape, an adhesive coating liquid containing an adhesive polymer and a crosslinking agent is coated on one surface of the release film, and dried to form an adhesive layer. The resulting adhesive layer is transferred onto the surface of the base film having a heat shrinkability. As the base film having a heat shrinkability, one having a shrinking rate in one direction or in two directions (longitudinal and transverse) at a temperature of from 50 to 99° C., preferably from 50 to 80° C., of from 5 to 50% is preferred. The release film may be, in substance, any film having a surface tension lower than that of the base film irrespective to the absolute value of the surface tension. The heat resistance of the release film influences the drying property of the adhesive coated on the surface thereof. When the heat resistance is low, the drying temperature of the adhesive must be low, and a long period of time is required for drying. Furthermore, for example, the release film sometimes suffers heat shrinking in a drying furnace, to produce a problem of formation a wrinkle in the release film, and an adhesive layer having a uniform thickness sometimes cannot be formed. In view of the standpoint described above, it is preferred that the release film has a prescribed heat resistance. As a standard of evaluation of the heat resistance, it is preferred to have a Vicat softening point of 100° C. or more. The species of the release film is not limited as far as the conditions described above are satisfied. It may be a single film or a laminated film, and can be appropriately selected from the commercially available products.

Specific examples of the release film include a film produced from high density polyethylene, polypropylene, polyethylene terephthalate, a polyamide series resin and a mixture of them. Preferably, a high density polyethylene film, a polypropylene film and a polyethylene terephthalate film can be exemplified. The process for producing these films is not particularly limited, and those produced by the known method, such as an extrusion method and a calendering molding method, can be used. The processing temperature may be the glass transition temperature or the softening point of the raw material resin or higher, and less than the decomposition temperature.

In order to decrease the peeling stress of the adhesive layer from the release film, a releasing agent such as those of silicone series may be coated on the surface of the release film, on which the adhesive is coated, as long as the adhesive layer is not contaminated. The thickness of the release film is generally from 10 to 1,000 μm, and preferably from 20 to 100 μm while depending on the drying conditions, the species and thickness of the adhesive layer, the processing conditions and processing method of the adhesive tape.

The heat shrinkability of the adhesive tape influences the peeling property from the surface of the semiconductor wafer. When the shrinking rate is too low, there are cases where defective peeling occurs, and a long period of time is required for peeling. When the shrinking rate is too high, the adhesive tape is deformed due to aging on storage, and therefor the workability on adhering the adhesive tape on the front surface of the wafer. In view of the point described above, the heat shrinking rate of the adhesive tape at a temperature of from 50 to 99° C. preferably from 50 to 80° C., is preferably from 5 to 50%. A tape exhibiting the heat shrinkability described above is at least at one point within the temperature range described above.

The material of the base film constituting the adhesive tape is not particularly limited. Specific examples thereof include films comprising an ethylene-vinyl acetate copolymer, an ethylene-methacrylic acid copolymer, a polybutadiene copolymer, polybutadiene, a non-rigid vinylchloride resin, a polyolefin, a polyester, a polyamide, an ionomer, a copolymer elastomer of them, a diene series resin, a nitrile series resin and an acrylic series resin. The base film may be a single film or a laminated film.

Taking the prevention of breakage of the semiconductor wafer on grinding the back surface of the wafer into consideration, a film having an elasticity obtained by processing a resin having a Shore D hardness defined in ASTM D-2240 of 40 or less into a film form, such as an ethylene-vinyl acetate copolymer (hereinafter referred to as an EVA) film and a polybutadiene film, is preferably employed. In this case, it is preferred that a film harder than it, specifically a film having a heat shrinkability obtained by molding a resin having a Shore D hardness of more than 40 into a film form, is laminated thereon. By the lamination, the rigidity of the adhesive tape is increased to improve the adhering workability and the peeling workability.

The thickness of the base film can be appropriately defined depending on the shape, the surface conditions, the grinding method and the grinding conditions of the semiconductor wafer to be protected, and the cutting and adhering workability of the adhesive tape. The thickness of the base film is generally from 10 to 1,000 μm, and preferably from 100 to 300 μm.

The process for producing the base film is not particularly limited, and it may be those produced by the known methods, such as an extrusion method and a calendering method. The processing temperature may be the glass transition temperature or the softening point of the raw material resin or higher, and less than the decomposition temperature. In order to impart a heat shrinkability to the base film, it is preferably subjected to at least a uniaxial stretching. The stretching ratio influences the peeling property and workability on peeling the adhesive tape from the front surface of the wafer after the grinding of the back surface of the wafer. When the stretching ratio is too low, shrinkage of the base film does not sufficiently occur on heating to peel from the front surface of the wafer, so that the peeling property and the workability are lowered. Taking the points described above into consideration, the stretching ratio is 1.2 times or more, and preferably 1.5 times or more. The stretching direction of the base film may be uniaxial stretching in the longitudinal direction or the transverse direction of the film, or may be biaxial stretching, in which the film is stretched in both the longitudinal direction and the transverse direction of the film. The upper limit of the stretching ratio is about 10 time taking the breakage on stretching into consideration.

The method for stretching is not particularly limited, and the known stretching method, such as a uniaxial stretching method, e.g., a roll pressing method and a roll stretching method, a longitudinal/transverse sequential biaxial stretching method using a tentering machine, and a longitudinal/transverse simultaneous biaxial stretching method using a tentering machine. The stretching temperature is preferably from 40 to 70° C. The base film thus stretched according to the above is subjected to a heat treatment in order to prevent the film from shrinkage with the lapse of time. The temperature of the heat treatment is preferably from 45 to 80° C.

The surface tension of at least the surface of the base film, on which the adhesive layer is laminated is necessarily higher than the surface tension of the surface of the release film, on which the adhesive layer is provided. In general, a film having a surface tension higher than the surface tension of the release film can be used as the base film irrespective of the absolute value of the surface tension. The base film preferably has a surface tension of 35 dyne/cm or more. When the surface tension is too low, the adhesion property between the base film and the adhesive layer is lowered, and the transfer of the adhesive layer from the release film cannot be conducted under good conditions. As a method for increasing the surface tension of the base film, a corona discharge treatment can be exemplified.

The composition of the adhesive is not particularly limited and can be appropriately selected from the commercially available products. From the standpoint of adhesive property, coating property and non-contamination property of the surface of the wafer, an acrylic series adhesive is preferred. The acrylic series adhesive is generally produced by mixing an acrylic series adhesive polymer with a crosslinking agent.

The acrylic series adhesive polymer can be obtained by copolymerizing a mixture of an acrylic acid alkyl ester monomer and amonomer containing a carboxyl group. Furthermore, a vinyl monomer, a polyfunctional monomer and an intra-crosslinking monomer that can be copolymerizable with those monomers can be copolymerized depending on necessity.

Examples of the acrylic acid alkyl ester monomer include methyl acrylate, methyl methacrylate, ethyl acrylate, ethyl methacrylate, propyl acrylate, propyl methacrylate, butyl acrylate, butyl methacrylate, hexyl acrylate, hexyl methacrylate, octyl acrylate, octyl methacrylate, nonyl acrylate, nonyl methacrylate, dodecyl acrylate and dodecyl methacrylate. The side chain of these monomers may be linear or branched. The acrylic acid alkyl ester monomers described above may be used in combination of two or more of them.

Examples of the monomer containing a carboxyl group include acrylic acid, methacrylic acid, crotonic acid, itaconic acid, maleic acid and fumaric acid. Examples of the vinyl monomer that is copolymerizable with the acrylic acid alkyl ester monomer and the monomer containing a carboxyl group include hydroxyethyl acrylate, hydroxyethyl methacrylate, hydroxypropyl acrylate, hydroxypropyl methacrylate, acrylamide, methacrylamide, dimethylamino acrylate, dimethylamino methacrylate, vinyl acetate, styrene and acrylonitrile.

Examples of the polymerization mechanism of the adhesive polymer include radical polymerization, anionic polymerization and cationic polymerization. In view of the production cost of the adhesive, the influence of the functional group of the monomer and the influence of the ion on the front surface of the semiconductor wafer, it is preferred to conduct polymerization by radical polymerization. Examples of a radical polymerization initiator include an organic peroxide, such as benzoyl peroxide, acetyl peroxide, isobutyryl peroxide, octanoyl peroxide, di-t-butyl peroxide and di-t-amyl peroxide, an inorganic peroxide, such as ammonium persulfate, potassium persulfate and sodium persulfate, and an azo compound, such as 2,2'-azobisisobutyronitrile, 2,2'-azobis-2-methylbutyronitrile, and 4,4'-azobis-4-cyanovaleric acid.

In the case where the polymerization is conducted by the emulsion polymerization, a water soluble inorganic peroxide, such as ammonium persulfate, potassium persulfate and sodium persulfate, and an azo compound containing a carboxyl group in the molecule, such as 4,4'-azobis-4-cyanovaleric acid, are preferred among them. In view of the influence of the ion on the front surface of the semiconductor wafer, an azo compound containing a carboxyl group in the molecule, such as 4,4'-azobis-4-cyanovaleric acid is more preferred.

In order to adjust the adhesive force and the cohesive force, it is preferred that the adhesive coating liquid contains a crosslinking agent that can react with the functional group contained in the adhesive polymer. The crosslinking agent preferably contains two or more crosslinking functional groups in one molecule. Examples of the crosslinking agent include an epoxy series compound, such as sorbitol polyglycidyl ether, polyglycerol polyglycidyl ether, pentaerythritol polyglycidyl ether, diglycerol polyglycidyl ether, glycerol polyglycidyl ether, neopentylglycol diglycidyl ether and resorcin diglycidyl ether, an isocyanate compound, such as tetramethylene diisocyanate, hexamethylene diisocyanate, toluene diisocyanate tri-adduct of trimethylolpropane and polyisocyanate, an aziridine series compound, such as trimethylolpropane-tri-β-aziridinyl propionate, tetramethylolmethane-tri-β-aziridinyl propionate, N,N'-diphenylmethane-4,4'-bis(1-aziridine carboxyamide), N,N'-hexamethylene-1,6-bis(1-aziridine carboxyamide), N,N'-toluene-2,4-bis-aziridine carboxyamide, and trimethylolpropane-tri-β-(2-methylaziridine) propionate, and a melamine series compound, such as hexamethoxymethylolmelamine. These may be used singly or in combination with two or more of them.

In general, the crosslinking agent is added in such a range of the amount that the number of the functional groups contained in the crosslinking agent does not exceed the number of the functional groups contained in the adhesive polymer. However, in the case where a functional group is newly formed by the crosslinking reaction, or in the case where the crosslinking reaction is slow, it may be excessively added depending on necessity. The adhesive force of the adhesive tape is generally from 10 to 1,000 g per 25 mm, preferably from 30 to 600 g per 25 mm, as converted to the adhesive force against a SUS-BA plate. It is adjusted within the range described above taking the grinding conditions of the back surface of the wafer, the diameter of the wafer and the thickness of the wafer after grinding into consideration. As a standard, from 0.1 to 30 parts by weight of the crosslinking agent is added to 100 parts by weight of the adhesive polymer. It is preferably from 0.3 to 15 parts by weight.

A surface active agent may be added to the adhesive agent to such an extent that the front surface of the wafer is not contaminated. As the surface active agent to be added, either a nonionic one or an anionic one may be added as long as it does not contaminate the front surface of the wafer. Examples of the nonionic surface active agent include polyoxyethylene octylphenyl ether, polyoxyethylene nonylphenyl ether and polyoxyethylene lauryl ether. Examples of the anionic surface active agent include an alkyl diphenyl ether disulfonate and a salt thereof, bisnaphthalene sulfonate and a salt thereof, polyoxyethylene alkylsulfosuccinic acid ester and a salt thereof, and a sulfuric ester of polyoxyethylene phenyl ether and a salt thereof.

The surface active agent may be used singly or in combination of two or more of them. The content of the surface active agent is preferably from 0.05 to 5 parts by weight per 100 parts by weight of the total amount of the adhesive polymer and the crosslinking agent, i.e., the crosslinked adhesive polymer. It is more preferably from 0.05 to 3 parts by weight.

As a method for coating the adhesive coating liquid onto one surface of the base film or the release film, conventionally known methods, such as a roll coating method, a gravure roll coating method and a bar coating method, can be employed. The drying conditions of the adhesive thus coated are not particularly limited, and it is preferably dried in a temperature range of from 80 to 200° C. for from 10 seconds to 10 minutes. It is more preferably dried at a temperature of from 80 to 170° C. for from 15 seconds to 5 minutes. The thickness of the adhesive layer is appropriately determined depending on the surface conditions and the shape of the front surface of the semiconductor wafer, and the grinding conditions of the back surface. It is about from 2 to 100 μm taking the adhesive force on grinding the back surface of the semiconductor wafer and the peeling property after completion of the grinding into consideration. It is preferably about from 5 to 70 μm.

After forming the adhesive layer on the surface of the release film, the base film is adhered on the surface of the adhesive layer, and the adhesive layer is transferred to the surface of the base film by pressing. As the method of transferring, a conventional method can be employed. For example, a method can be exemplified, in which the base film is superimposed on the surface of the adhesive layer formed on the surface of the release film, and they are pressed by passing through nip rolls. The time at which the release film is peeled from the surface of the adhesive layer is preferably immediately before the time at which it is used as the adhesive tape. The adhesive tape thus obtained is made into a roll form or cut to a prescribed shape, and then subjected to storage and transportation.

A series of preparation process steps of a semiconductor wafer from the step of adhering the adhesive tape on the front surface of the semiconductor wafer to the dicing step is described in detail below.

In the invention, the adhesive tape is adhered on the front surface of the semiconductor wafer through the adhesive layer. This operation may be conducted manually, but is generally conducted by an apparatus called an automatic application machine, to which an adhesive tape in the form of a roll is installed. Examples of the automatic application machine include Model ATM-1000B and Model ATM-1100 produced by Takatori Corp. and STL Series produced by Teikoku Seiki Co., Ltd.

The semiconductor wafer is fixed on a chuck table of a grinding machine for grinding the back surface of the wafer through the base film layer of the adhesive tape. The back surface of the wafer is then ground to a prescribed thickness.

On grinding, it is general that cooling water is poured onto the grinding surface. As a method for grinding the back surface, a known method, such as a through feeding method and an infeed method. The thickness of the semiconductor wafer, which has been from 500 to 1,000 μm before the grinding of the back surface, is ground to the thickness of from 80 to 400 μm, preferably from 80 to 200 μm, after the grinding of the back surface. In general, the thickness of the semiconductor wafer before grinding is appropriately determined by the diameter and the species of the wafer, and the thickness after grinding is appropriately determined by the size of the chip and the species of the IC. After completing the grinding, pure water is poured onto the ground surface to remove grinding dusts. Thereafter, the wafer is installed in a cartridge and transferred to a cleaning machine.

In the cleaning machine, the back surface of the semiconductor wafer is fixed on a chuck table. The adhesive tape is heated by pouring warm water, and the adhesive tape is peeled by shrinking the base film. The peeled adhesive tape is removed from the wafer surface by a method, such as a method of rotating the chuck table while pouring warm water, a method of pouring water and then rotating the chuck table, and a method of pouring water with high pressure. Alternatively, it may be removed by using a special tool. After removing the adhesive tape, the front surface of the wafer is cleaned in the cleaning machine. Finally, the wafer is dried by rotating at a high speed to complete the series of steps. Thereafter, the wafer is transferred to the subsequent step, such as a dicing step.

In the process described above, the back surface of the wafer is sometimes subjected to chemical etching after grinding the back surface of the wafer before peeling the adhesive tape. In the chemical etching step, the ground back surface of the wafer is subjected to a etching treatment by using nitric acid, hydrofluoric acid and a mixed acid.

The state of the adhesive tape peeled used herein means the state, in which the adhesive tape that has been adhered on the front surface of the wafer is peeled through 20% or more of the front surface of the wafer. Because the method of pouring warm water is used as a heating means in the invention, warm water penetrates into most of the interface between the front surface of the wafer and the adhesive layer that is not in the state of peeling, and the adhesive force between the adhesive layer and the front surface of the wafer is lowered.

In the invention, it is preferred that on peeling the adhesive tape having a heat shrinkability, warm water is poured in the conditions in that the back surface of the semiconductor wafer is fixed on the chuck table of the cleaning machine. The semiconductor wafer is reinforced by fixing on the chuck table. Accordingly, the breakage of the semiconductor wafer due to the peeling stress of the adhesive tape can be prevented. Particularly, in the case where the semiconductor wafer has a large size or has a small thickness, it is preferred that the semiconductor wafer is firmly fixed on the chuck table of the cleaning machine to be reinforced.

As the chuck table, one having a disk-shaped holding part is generally employed. With considering that the back surface of the semiconductor wafer is surely held and reinforced, a vacuum adsorption method is preferred. The degree of vacuum for the vacuum adsorption method is preferably from −100 to −720 mmHg. It is more preferably from −300 to −720 mmHg. The area of the adsorption surface of the chuck table is preferably as large as possible. It is generally 15% or more of the area of the back surface of the semiconductor wafer while it is changed depending on the diameter and the thickness of the semiconductor wafer. It is preferably 25% or more, and more preferably 50% or more. The upper limit of the adsorption area is the size that can hold 100% of the back surface of the semiconductor wafer. The position at which the wafer is held is the substantially central position of the semiconductor wafer. Furthermore, in order to hold the semiconductor wafer after grinding with good balance, the circular adsorption surface is preferred.

In general, when the adhesive tape is peeled from the wafer after grinding the back surface of the semiconductor wafer, the position, at which the breakage is most liable to occur, is the central position of the semiconductor wafer. Because the central position of the semiconductor wafer is fixed to the chuck table to be reinforced in the invention, the breakage of the semiconductor wafer does not occur. On the other hand, in the case where the heating and peeling of the adhesive tape is conducted by a method of immersing in a warm water bath, it is difficult to ensure the prevention of breakage of the semiconductor wafer because it cannot be fixed on a chuck table of a peeling machine.

A chuck table of a rotation type is preferably used with considering that the wafer is cleaned and dried after peeling the adhesive tape. Such a chuck table of a rotation type is called a spin chuck and a rotation type vacuum adsorption arm. In the case where the spin chuck is used, the rotation number of the spin chuck is preferably changed depending on the objective operation. Specifically, the rotation number on peeling the adhesive tape is preferably from 5 to 2,000 rpm, that on cleaning the wafer is preferably from 10 to 5,000 rpm, and that on drying the wafer is preferably from 500 to 10,000 rpm.

The amount of warm water used to peel the adhesive tape influences the peeling property of the adhesive tape. While depending on the species of the semiconductor wafer, the characteristics of the adhesive tape and the temperature of the warm water, it is generally from 100 to 5,000 ml/min. The period of time of pouring water also influences the peeling property. The period of time of pouring water is from 1 to 60 seconds, and preferably from 10 to 30 seconds while varying depending on the stretching ratio of the base film and the temperature of the warm water.

As the warm water, pure water, deionized water or distilled water heated to a prescribed temperature is used. The temperature of the warm water is generally from 50 to 90° C. while depending on the stretching ratio of the base film and the adhesive force of the adhesive tape. It is preferably from 50 to 80° C.

As the method of pouring the warm water, a method is preferred, in which the warm water penetrates into the interface between the adhesive tape and the front surface of the wafer. An example of such a method is a method of pouring water onto the edge of the adhesive tape. With considering that the warm water is supplied with good efficiency, it is supplied using a spin chuck as the chuck table and the semiconductor wafer being rotated. The rotation number on pouring the warm water is preferably from 5 to 2,000 rpm. The detailed conditions on rotating the semiconductor wafer using the spin chuck can be appropriately selected from a method, in which the semiconductor wafer is not rotated on initiating water pouring and is rotated during the pouring, and a method, in which the rotation number is changed during the pouring, with considering the properties of the adhesive tape, the temperature of the warm water, the amount of the poured water, and the diameter and the thickness of the semiconductor wafer. Furthermore, on pouring water, it is preferred to appropriately change the position, temperature, amount and time of pouring water to prevent the front surface of the wafer from contamination due to grinding dust formed on grinding the back surface of the wafer.

After peeling the adhesive tape, the front surface of the wafer is cleaned subsequently in the cleaning machine. The cleaning of the front surface of the wafer is conducted by supplying a cleaning liquid onto the front surface of the wafer. As the cleaning liquid, the warm water used on peeling the adhesive tape, as well as pure water, an alcohol such as isopropyl alcohol, acetone, a resist remover and a mixture thereof, which have been used for surface cleaning, can be preferably used. Two or more of cleaning liquids may be supplied sequentially. The cleaning liquid is preferably supplied with rotating the semiconductor wafer on cleaning. The cleaning effect can be further increased by using ultrasonic cleaning in combination therewith. The supplying amount of the cleaning liquid is preferably from 100 to 5,000 ml/min. The cleaning time is preferably from 10 seconds to 10 minutes. In the case where the semiconductor wafer is rotated on cleaning, the preferred rotation number is from 10 to 5,000 rpm.

After cleaning the front surface of the wafer, the surface of the semiconductor wafer is dried. As a method for drying, a spin drying method is generally employed. The rotation number on spin drying is preferably from 500 to 10,000 rpm. After drying, the semiconductor wafer is installed in a cartridge and transferred to the subsequent step such as a dicing step.

The size of the semiconductor wafer, to which the invention can be applied, is a large-sized one having a diameter of from 6 to 16 inches, and preferably from 6 to 12 inches.

EXAMPLE

The invention will be described in more detail with reference to the following example, but the invention is not construed as being limited thereto. The characteristic values shown in the example were measured according to the following methods.

(1) Shrinking Rate of Adhesive Tape (%)

Arbitrary positions of an adhesive tape were selected, and 15 pieces of test samples of a 10 cm square were prepared. After peeling a release film from the test sample, the test sample was heated in an air oven at 25° C., 50° C. or 80° C. for 1 minute, followed by being allowed to stand at room temperature for 5 minutes. The length of the test sample in the longitudinal direction (mechanical direction) was measured to obtain a shrinking rate from the length values before and after heating. The shrinking rate $\{(L_1-L_2)/L_1\}\times 100$ (%) is determined from the length value before heating ($L_1$) and the length value after heating ($L_2$). The same measurement was repeated 5 times to obtain an average value for each condition.

(2) Measurement of Contamination of Wafer Surface by ESCA

An 8-inch silicon mirror wafer used in the example was cut into 1 cm squares along with a scribe line by a diamond cutter with preventing the surface from contamination. The surface of the cut wafer was measured by using an ESCA under the following conditions to obtain a ratio of carbon to silicon (hereinafter referred to as a C/Si ratio) so that the contamination conditions due to organic substances of the silicon wafer were measured.

(Measurement Conditions of ESCA and C/Si Ratio Calculation Method)
X-ray source: MgKα ray (1,253.6 eV)
X-ray power: 300 W
Vacuum degree on measurement: $2\times 10^{-7}$ Pa or less
C/Si: (peak area for carbon)/(peak area for silicon)

(Evaluation Method of C/Si Ratio)

The C/Si ratio of the silicon mirror wafer before adhering a sample (adhesive tape) was 0.10 (blank value). Therefore, the C/Si value of the surface of the silicon mirror wafer after adhering sample of about from 0.10 to 0.12 was designated as no contamination, and that exceeding the value was designated as contaminated.

(3) Adhesive Force (g/25 mm)

Measured in accordance with the method defined in JIS Z-0237-1991 except the following conditions.

At 23° C., a sample (adhesive tape) was adhered on a SUS-BA plate having a width of 5 cm and a length of 20 cm through an adhesive layer, followed by being allowed to stand for 1 hour. One edge of the sample was clamped, and a stress on peeling the sample from the SUS-BA plate at a peeling angle of 180° and a peeling speed of 300 mm/min was measured and converted to the unit of gram per 25 mm.

Example 1

148 parts by weight of deionized water, 2 parts by weight of an ammonium salt of polyoxyethylene nonylphenyl ether sulfate (produced by Nippon Nyukazai Co., Ltd., trade name: Newcol-560SF, aqueous solution of 50% by weight) as an anionic surface active agent (1 part by weight as a pure surface active agent component), 0.5 part by weight of ammonium persulfate as a polymerization initiator, 74 parts by weight of butyl acrylate, 14 parts by weight of methyl methacrylate, 9 parts by weight of 2-hydroxyethyl methacrylate, 2 parts by weight of methacrylic acid and 1 part by weight of acrylamide were mixed and subjected to emulsion polymerization under stirring at 70° C. for 9 hours, to obtain an acrylic resin series aqueous emulsion. The emulsion was neutralized with aqueous ammonia of 14% by weight to obtain an adhesive polymer (chief material) emulsion having a solid content of about 40% by weight. 100 parts by weight of the resulting adhesive chief material emulsion (adhesive polymer concentration: about 40% by weight) was collected and adjusted to pH 9.3 with aqueous ammonia of 14% by weight. 2 parts by weight of an aziridine series crosslinking agent (produced by Nippon Shokubai Co., Ltd., Chemitite Pz-33) and 5 parts by weight of diethyleneglycol monobutyl ether as a film forming assistant were added to obtain an adhesive coating liquid.

A polypropylene film produced into a film by a T-die extruding method having a thickness of 50 μm, a Vicat softening point of 140° C. and a surface tension of one surface of 30 dyne/cm was used as a release film, and the acrylic series resin aqueous emulsion type adhesive obtained according to the method described above was coated on the one surface of the release film by a roll coater method, followed by drying at 100° C. for 60 minutes, to provide an acrylic series adhesive layer having a thickness of 10 μm on the surface of the release film.

A non-stretched ethylene-vinyl acetate copolymer (hereinafter referred to as an EVA) film produced into a film form by a T-die extruding method was stretched in the longitudinal direction to 3.0 times at 50° C. and was heat fixed at 60° C. to obtain a uniaxially stretched EVA film having a thickness of 120 μm. One surface of the uniaxially stretched EVA film was subjected to a corona discharge treatment, to make the surface tension to 50 dyne/cm, and it was used as a base film.

The corona discharge-treated surface of the base film was superimposed on the surface of the acrylic series adhesive layer provided on the surface of the release film to laminate with each other, and they were pressed with a pressure of 2 kg/cm² to transfer the adhesive layer onto the surface of the base film, so that an adhesive tape for protecting the front surface of the semiconductor wafer having an adhesive force of 200 g per 25 mm was obtained. The heat shrinking rates of the adhesive tape at each temperature were measured according to the method described above. The results are shown in Table 1.

As a semiconductor wafer, a mirror wafer having a diameter of 8 inches and a thickness of 700 μm (in which scribe lines having a depth of 2 μm and a width of 100 μm were provided in the longitudinal and transverse directions with an interval of 1 cm reaching the edge thereof) was used. The resulting adhesive tape was adhered on the surface of the mirror wafer, on which the scribe lines had been present, a surplus part was cut along the outer circumference of the wafer. The adhesive tape was adhered to 50 pieces of the mirror wafers. The mirror wafer having the adhesive tape adhered thereon was subjected to a back surface grinding machine. In the grinding machine, the wafer was coarsely ground at a grinding speed of 300 μm/min to a thickness of 170 μm, and then finely ground at a grinding speed of 20 μm/min to a thickness of 150 μm, and finally the back surface was cleaned. After cleaning, the mirror wafers were installed in a cartridge. On installing in the cartridge, 2 pieces of wafers were broken due to contact with an installation inlet. The period of time required from the start of grinding to the installation was 100 minutes.

The mirror wafers having the adhesion tape adhered thereon, the back surface of which has been ground, contained in the cartridge were transferred to a wafer cleaning machine of a single wafer type. In the cleaning machine, the back surface of the mirror wafer was fixed by a spin chuck (circular shape, diameter: 6 inches, vacuum degree: −600 mmHg), and warm water (pure water) at 60° C. was poured on the edge of the adhesive tape at 3,000 ml/min for 10 seconds with the wafer rotating at 12 rpm. The warm water was poured for further 10 seconds with the wafer rotating at 500 rpm to peel the adhesive tape. The adhesive tape thus peeled was removed from the front surface of the wafer while the wafer was rotating.

After removing the adhesive tape, pure water at 20° C. was poured onto the surface of the mirror wafer at 500 ml/min for 1 minute with the mirror wafer rotating at 1,000 rpm, and further pure water applied with ultrasonic wave of about 1.5 MHz was poured at 800 ml/min for 1 minute. The wafer was then dried by rotating at 3,000 rpm. After drying, the wafers were installed in a cartridge. The period of time required from the completion of the back surface grinding to the installation of the mirror wafers into the cartridge after cleaning was 135 minutes. No wafer was broken in the steps after the transfer to the cleaning machine. The state of the front surface contamination of the 8-inch mirror wafers installed in the cartridge was measured according to the method described above. The results obtained are shown in Table 1.

Example 2

The grinding of the back surface of the mirror wafer, the peeling of the tape and the cleaning of the front surface of the wafer were conducted in the same manner as in Example 1 except that a mirror wafer having a diameter of 6 inches and a thickness of 600 μm (having the scribe lines same as in Example 1) was used as a semiconductor wafer, the thickness after the coarse grinding was 130 μm, and the thickness after the fine grinding was 90 μm. However, the grinding speed on grinding the back surface was 320 μm/min for the coarse grinding and 30 μm/min for the fine grinding, and the temperature of the warm water on peeling the adhesive tape was 80° C. As a result, 2 pieces of wafers were broken due to contact with an installation inlet on installing in the cartridge. No wafer was broken on the other steps. The period of time required from the start of grinding to the installation was 85 minutes. The period of time required from the completion of the back surface grinding to the installation of the mirror wafers into the cartridge after cleaning was 135 minutes. The state of the front surface contamination of the 6-inch mirror wafers installed in the cartridge was measured according to the method described above. The results obtained are shown in Table 1.

Comparative Example 1

An adhesive tape having an adhesive force of 200 g per 25 mm was obtained in the same manner as in Example 1 except that one surface of a non-stretched EVA film having a thickness of 120 μm was subjected to a corona discharge treatment to make the surface tension to 50 dyne/cm, and it was used as a base film. The resulting adhesive tape was adhered on the front surface of 50 pieces of the same wafer as in Example 1 (mirror wafers having a diameter of 8 inches and a thickness of 700 μm), which was then subjected to the back surface grinding machine. After conducting the coarse grinding and the fine grinding in the back surface grinding machine in the same manner as in Example 1, the back surface was cleaned and dried, and the wafers were installed in a cartridge. 2 pieces of wafers were broken due to contact with an installation inlet on installing in the cartridge. The period of time required from the start of grinding to the installation into the cartridge was 100 minutes. The wafer was then subjected to a adhesive tape peeling machine, to peel the adhesive tape by adhering a peeling tape on the adhesive tape and peeling the adhesive tape by utilizing the adhesive force of the peeling tape. 2 pieces of wafers were broken on peeling the tape. The period of time required from the completion of grinding to the peeling of the tape was 75 minutes. The wafers were transferred to the wafer cleaning step and subjected to pre-cleaning and main cleaning for 3 minutes and 5 minutes, respectively, in a cartridge type cleaning bath. They were then dried in a rotation type dryer. 1 piece was broken on transferring to the cleaning step, and another 1 piece was broken on drying. The period of time required from the completion of the peeling of the tape to the completion of cleaning was 70 minutes. The state of surface contamination of the 8-inch mirror wafers installed in the cartridge was measured according to the method described above. The results obtained are shown in Table 1.

Comparative Example 2

The grinding of the back surface of the semiconductor wafer and the peeling of the adhesive tape were conducted in by using the same semiconductor wafer and the same adhesive tape under the same conditions and methods as in Comparative Example 1. The period of time required from the start of grinding to the installation of the wafer into the cartridge was 100 minutes. The period of time required from the completion of the grinding to the peeling of the tape was 75 minutes. 3 pieces of wafers (ground the back surface) were broken due to contact with an installation inlet on installing in the cartridge. 3 pieces of wafers were broken on peeling the tape. The semiconductor wafers after peeling the tape that had not been broken were transferred to the same wafer cleaning machine of a single wafer type as in Example 1, and the surface of the wafer was cleaned in the same manner as in Example 1 except that the pouring of warm water was not conducted. The period of time required from the completion of peeling the tape to the completion of the cleaning was 110 minutes. The state of surface contamination of the 8-inch mirror wafers installed in the cartridge was measured according to the method described above. The results obtained are shown in Table 1.

Comparative Example 3

By using the same adhesive tape and semiconductor wafer as in Example 1, and the wafers were conducted the back surface grinding in the same conditions and method as in Example 1, and then, 50 pieces of the wafers after grinding were installed in a cartridge. 2 pieces of wafers were broken due to contact with an installation inlet on installing in the cartridge. The period of time required from the start of the grinding to the installation was 100 minutes. The mirror wafers after grinding, to which the adhesive tape was adhered, for each cartridge were immersed in a cleaning bath of a cartridge type filled with warm pure water at 60° C. for 30 seconds. The adhesive tape was shrunk in the cleaning bath and peeled. 5 pieces of the wafers were broken on shrinking and peeling. After conducting removal of the broken wafers and removal of the adhesive tape after peeling, the main cleaning was conducted under the same conditions as in Comparative Example 1 for 5 minutes. The wafers were then dried in a rotation type dryer. 1 piece of the wafer was broken on drying. The period of time required from the completion of the back surface grinding to the installation of the mirror wafers into the cartridge after cleaning was 150 minutes, because time was spent on removal of the broken wafers and removal of the peeled tape. The state of surface contamination of the 8-inch mirror wafers installed in the cartridge was measured according to the method described above. The results obtained are shown in Table 1.

TABLE 1

|  | Example 1 | Example 2 | Comparative Example 1 | Comparative Example 2 | Comparative Example 3 |
|---|---|---|---|---|---|
| Adhesive tape |  |  |  |  |  |
| Base film |  |  |  |  |  |
| Composition | EVA | EVA | EVA | EVA | EVA |
| Stretching ratio (times) | 3.0 | 3.0 | non-stretched | non-stretched | 3.0 |
| Stretching direction | uniaxial (longitudinal) | uniaxial (longitudinal) | non-stretched | non-stretched | uniaxial (longitudinal) |
| Shrinking rate (%) |  |  |  |  |  |
| 25° C. | 0 | 0 | 0 | 0 | 0 |
| 50° C. | 10 | 10 | 0 | 0 | 10 |
| 80° C. | 40 | 40 | 0 | 0 | 40 |
| Adhesive force (g/25 mm) | 200 | 200 | 200 | 200 | 200 |
| Wafer |  |  |  |  |  |
| Species | 8-inch mirror wafer | 6-inch mirror wafer | 8-inch mirror wafer | 8-inch mirror wafer | 8-inch mirror wafer |
| Thickness after back surface grinding ($\mu$m) | 150 | 90 | 150 | 150 | 150 |
| Result of preparation of semi-conductor wafer |  |  |  |  |  |
| Method |  |  |  |  |  |
| Tape peeling | warm water pouring, fixed on chuck | warm water pouring, fixed on chuck | Special peeling machine | Special peeling machine | Immersed in warm water (cartridge type) |
| Wafer cleaning | Single wafer type (fixed on chuck) | Single wafer type (fixed on chuck) | Cartridge type | Single wafer type (fixed on chuck) | Cartridge type |
| Time (min) |  |  |  |  |  |
| Back surface grinding | 100 | 85 | 100 | 100 | 100 |
| Tape peeling | 135 | 135 | 70 | 75 | 150 |
| Wafer cleaning |  |  | 75 | 110 | 150 |
| Total | 235 | 220 | 245 | 285 | 250 |
| Breakage of wafer (piece) |  |  |  |  |  |
| Back surface grinding | 2 (on installing in cartridge) | 2 (on installing in cartridge) | 2 (on installing in cartridge) | 3 (on installing in cartridge) | 2 (on installing in cartridge) |
| Tape peeling | 0 | 0 | 2 | 3 | 5 |
| Wafer cleaning | 0 | 0 | 2 (1 on transferring) | 0 | 1 |
| Total | 2 | 2 | 6 | 6 | 8 |

TABLE 1-continued

| | Example 1 | Example 2 | Comparative Example 1 | Comparative Example 2 | Comparative Example 3 |
|---|---|---|---|---|---|
| ESCA analysis (C/Si, evaluation of contamination) | 0.11 (no contamination) | 0.11 (no contamination) | 0.12 (no contamination) | 0.11 (no contamination) | 0.12 (no contamination) |

What is claimed is:

1. A preparation process of a semiconductor wafer, the process comprising the steps of: adhering an adhesive tape on a front surface of a semiconductor wafer; grinding a back surface of said semiconductor wafer by a grinding machine; peeling said adhesive tape; and cleaning said front surface of said semiconductor wafer, wherein an adhesive tape having heat shrinkability is used as said adhesive tape, and after grinding said back surface of said semiconductor wafer, warm water at a temperature of from 50 to 99° C. is poured to peel said adhesive tape in a wafer cleaning machine, and said front surface of said semiconductor wafer is cleaned in said wafer cleaning machine.

2. A preparation process of a semiconductor wafer as claimed in claim 1, wherein said temperature of said warm water is from 50 to 80° C.

3. A preparation process of a semiconductor wafer as claimed in claim 1, wherein said back surface of said semiconductor wafer is fixed on a chuck table of said wafer cleaning machine, and said warm water is poured onto said adhesive tape.

4. A preparation process of a semiconductor wafer as claimed in claim 3, wherein said chuck table of said wafer cleaning machine is a rotation type.

5. A preparation process of a semiconductor wafer as claimed in claim 3, wherein an area of said chuck table of said wafer cleaning machine is 15% or more of an area of said back surface of said semiconductor wafer.

6. A preparation process of a semiconductor wafer as claimed in claim 1, wherein an poured amount of said warm water is from 100 to 5,000 ml/min.

7. A preparation process of a semiconductor wafer as claimed in claim 1, wherein said back surface of said semiconductor wafer having a diameter of from 6 to 12 inches is ground to a thickness of from 80 to 400 μm.

8. A preparation process of a semiconductor wafer as claimed in claim 7, wherein the adhesive tape has a shrinking rate of from 5 to 50%, at a temperature falling in a range of from 50 to 99 C.

9. A preparation process of a semiconductor wafer as claimed in claim 8, wherein the tape comprises a base film having a thickness of from 10 to 1,000 μm and having on one surface thereof an adhesive layer having a thickness of from 2 to 100 μm.

10. A preparation process of a semiconductor wafer as claimed in claim 6, wherein the adhesive tape has a shrinking rate of from 5 to 50%, at a temperature falling in a range of from 50 to 99 C.

11. A preparation process of a semiconductor wafer as claimed in claim 10, wherein the tape comprises a base film having a thickness of from 10 to 1,000 μm and having on one surface thereof an adhesive layer having a thickness of from 2 to 100 μm.

12. A preparation process of a semiconductor wafer as claimed in claim 5, wherein the adhesive tape has a shrinking rate of from 5 to 50%, at a temperature falling in a range of from 50 to 99 C.

13. A preparation process of a semiconductor wafer as claimed in claim 12, wherein the tape comprises a base film having a thickness of from 10 to 1,000 μm and having on one surface thereof an adhesive layer having a thickness of from 2 to 100 μm.

14. A preparation process of a semiconductor wafer as claimed in claim 4, wherein the adhesive tape has a shrinking rate of from 5 to 50%, at a temperature falling in a range of from 50 to 99 C.

15. A preparation process of a semiconductor wafer as claimed in claim 14, wherein the tape comprises a base film having a thickness of from 10 to 1,000 μm and having on one surface thereof an adhesive layer having a thickness of from 2 to 100 μm.

16. A preparation process of a semiconductor wafer as claimed in claim 3, wherein the adhesive tape has a shrinking rate of from 5 to 50%, at a temperature falling in a range of from 50 to 99 C.

17. A preparation process of a semiconductor wafer as claimed in claim 16, wherein the tape comprises a base film having a thickness of from 10 to 1,000 μm and having on one surface thereof an adhesive layer having a thickness of from 2 to 100 μm.

18. A preparation process of a semiconductor wafer as claimed in claim 2, wherein the adhesive tape has a shrinking rate of from 5 to 50%, at a temperature falling in a range of from 50 to 99 C.

19. A preparation process of a semiconductor wafer as claimed in claim 18, wherein the tape comprises a base film having a thickness of from 10 to 1,000 μm and having on one surface thereof an adhesive layer having a thickness of from 2 to 100 μm.

20. A preparation process of a semiconductor wafer as claimed in claim 1, wherein the adhesive tape has a shrinking rate of from 5 to 50%, at a temperature falling in a range of from 50 to 99 C.

21. A preparation process of a semiconductor wafer as claimed in claim 20, wherein the tape comprises a base film having a thickness of from 10 to 1,000 μm and having on one surface thereof an adhesive layer having a thickness of from 2 to 100 μm.

* * * * *

UNITED STATES PATENT AND TRADEMARK OFFICE
CERTIFICATE OF CORRECTION

PATENT NO.    : 6,159,827
DATED         : December 12, 2000
INVENTOR(S)   : Makoto Kataoka, Yaunisa Fujii, Kentaro Hirai, Hideki Fukumoto and
                Masatoshi Kumagai It is certified that error appears in the above-identified patent and that said Letters Patent is hereby corrected as shown below:

Title page,
Item [56], References Cited, the dates of four Japanese patents should be changed accordingly: #2-028950 dated "9/1993" to -- 1/1990 --, #7-201787 dated "12/1993" to -- 8/1995 --, #8-222535 dated "2/1995" to -- 8/1996 --, #8-258038 dated "3/1995" to -- 10/1996 --.

Signed and Sealed this

Fourteenth Day of May, 2002

Attest:

JAMES E. ROGAN
Attesting Officer      Director of the United States Patent and Trademark Office